United States Patent
Yarita et al.

(10) Patent No.: US 10,876,082 B2
(45) Date of Patent: Dec. 29, 2020

(54) SURFACE TREATMENT COMPOSITION, METHOD FOR PRODUCING SURFACE TREATMENT COMPOSITION, SURFACE TREATMENT METHOD, AND METHOD FOR PRODUCING SEMICONDUCTOR SUBSTRATE

(71) Applicant: FUJIMI INCORPORATED, Aichi (JP)

(72) Inventors: Satoru Yarita, Aichi (JP); Tsutomu Yoshino, Aichi (JP); Shogo Onishi, Aichi (JP); Yukinobu Yoshizaki, Aichi (JP); Yasuto Ishida, Aichi (JP)

(73) Assignee: FUJIMI INCORPORATED, Aichi (JP)

( * ) Notice: Subject to any disclaimer, the term of this patent is extended or adjusted under 35 U.S.C. 154(b) by 116 days.

(21) Appl. No.: 16/127,482

(22) Filed: Sep. 11, 2018

(65) Prior Publication Data

US 2019/0085270 A1 Mar. 21, 2019

(30) Foreign Application Priority Data

Sep. 19, 2017 (JP) ................. 2017-179297

(51) Int. Cl.
*C11D 3/26* (2006.01)
*C11D 7/32* (2006.01)
*C09K 15/24* (2006.01)
*H01L 21/02* (2006.01)
*C11D 11/00* (2006.01)
*C09K 15/20* (2006.01)

(52) U.S. Cl.
CPC ............ *C11D 7/3245* (2013.01); *C09K 15/20* (2013.01); *C09K 15/24* (2013.01); *C11D 7/32* (2013.01); *C11D 7/3209* (2013.01); *C11D 11/0017* (2013.01); *C11D 11/0047* (2013.01); *H01L 21/02068* (2013.01); *H01L 21/02074* (2013.01)

(58) Field of Classification Search
CPC ... C11D 11/0047; C11D 11/0023; C11D 7/32; C11D 7/34; C11D 3/37
See application file for complete search history.

(56) References Cited

U.S. PATENT DOCUMENTS

| | | | | |
|---|---|---|---|---|
| 5,574,146 | A * | 11/1996 | Reddy | .................... C07H 19/10 536/25.34 |
| 9,803,161 | B2 | 10/2017 | Kawada et al. | |
| 9,960,051 | B2 * | 5/2018 | Suchentrunk | ....... C23C 18/1642 |
| 2010/0056026 | A1 * | 3/2010 | Shirota | ................ C09K 3/1436 451/41 |
| 2010/0237885 | A1 * | 9/2010 | Meng | ................. G01N 33/5438 324/717 |
| 2012/0280170 | A1 * | 11/2012 | De Rege Thesauro | ...................... H01L 21/3212 252/79.1 |

FOREIGN PATENT DOCUMENTS

WO WO2013/162020 A 10/2013

* cited by examiner

*Primary Examiner* — Charles I Boyer
(74) *Attorney, Agent, or Firm* — Katten Munchin Rosenman LLP

(57) ABSTRACT

A surface treatment composition according to the present invention is a surface treatment composition having a pH of lower than 7 and used for treating the surface of a polished object to be polished having a layer containing tungsten, and the surface treatment composition contains a tungsten etching inhibitor and water, wherein the tungsten etching inhibitor is a compound containing a monocyclic or fused polycyclic aromatic hydrocarbon ring having two or more substituents, and the substituents contain at least a nitrogen-containing group and an anionic group.

14 Claims, No Drawings

SURFACE TREATMENT COMPOSITION, METHOD FOR PRODUCING SURFACE TREATMENT COMPOSITION, SURFACE TREATMENT METHOD, AND METHOD FOR PRODUCING SEMICONDUCTOR SUBSTRATE

CROSS-REFERENCE TO RELATED APPLICATION

The present patent application is based on Japanese Patent Application No. 2017-179297, filed on Sep. 19, 2017, the entire disclosure of which is incorporated herein by reference.

BACKGROUND

1. Technical Field

The present invention relates to a surface treatment composition, a method for producing a surface treatment composition, a surface treatment method, and a method for producing a semiconductor substrate.

2. Description of Related Arts

In recent years, along with multilayer wiring of semiconductor substrate surfaces, so-called chemical mechanical polishing (CMP) technologies of physically polishing and flattening a semiconductor substrate have been utilized when devices are produced. CMP is a method of flattening the surface of an object to be polished (material to be polished) such as a semiconductor substrate by using a polishing composition (slurry) including abrasive grains of silica, alumina, ceria or the like, an anticorrosive agent, a surfactant, and the like, and the object to be polished (material to be polished) may be a wiring, a plug, or the like formed from, for example, silicon, polysilicon, silicon oxide, silicon nitride, or a metal.

On the surface of a semiconductor substrate after a CMP process, defects (foreign materials) remain in large quantities. Examples of the defects (foreign materials) include abrasive grains originating from the polishing composition used in CMP; metal residues; organic materials such as an anticorrosive agent and a surfactant; silicon-containing materials, which are objects of polishing; silicon-containing materials or metal residues produced by polishing a metal wiring, a plug or the like; and organic materials such as pad wastes produced from various pads and the like.

When a semiconductor substrate surface is contaminated by these defects (foreign materials), the electrical characteristics of the semiconductor are adversely affected, and there is a possibility that reliability of the device may be lowered. Therefore, it is desirable that a cleaning process is introduced after the CMP process, and these defects (foreign materials) are eliminated from the semiconductor substrate surface.

Regarding a cleaning agent (cleaning composition) used in such a cleaning process, for example, a cleaning composition for a semiconductor substrate, the cleaning composition including a phosphonic acid-based chelating agent, a particular monoamine, and water and having a pH of higher than 6 and lower than 7, is suggested in WO 2013/162020 A (corresponding to US 2015/140820 A). Furthermore, it is disclosed that when the above-described cleaning composition is used, foreign materials (polishing fine particles) can be removed without corroding the substrate surface (tungsten wiring or tungsten alloy wiring).

SUMMARY

However, when the inventors of the present invention conducted an investigation, they newly found that when a polished object to be polished having a layer containing tungsten (tungsten layer) on the surface is cleaned using the cleaning agent disclosed in WO 2013/162020 A (corresponding to US 2015/140820 A), there is a problem that the effect of suppressing corrosion (dissolution) of the tungsten layer is not sufficient.

The present invention was achieved in view of the problems described above, and it is an object of the invention to provide a means for suppressing the dissolution of a layer containing tungsten, the layer being included in a polished object to be polished, when a surface treatment is performed.

In view of the problems described above, the inventors of the present invention conducted a thorough investigation. As a result, the inventors found that the problems are solved by using a surface treatment composition that includes water and a tungsten etching inhibitor having a particular structure, and has the pH in a particular range. Thus, the inventors completed the invention.

That is, one embodiment of the present invention is a surface treatment composition having a pH of lower than 7 and used for treating the surface of a polished object to be polished having a layer containing tungsten, the surface treatment composition containing a tungsten etching inhibitor and water, wherein the tungsten etching inhibitor is a compound containing a monocyclic or fused polycyclic aromatic hydrocarbon ring having two or more substituents, and the substituents contain at least a nitrogen-containing group and an anionic group.

DETAILED DESCRIPTION

In the following description, embodiments of the present invention will be explained. Meanwhile, the invention is not intended to be limited to the following embodiments only. Furthermore, according to the present specification, unless particularly stated otherwise, the operations and measurement of physical properties are carried out under the conditions of room temperature (from 20° C. to 25° C.)/a relative humidity of from 40% RH to 50% RH.

A surface treatment composition according to an embodiment of the invention is used in order to treat the surface of a polished object to be polished having a layer containing tungsten. Meanwhile, according to the present specification, the term "surface treatment" is a concept including, for example, cleaning and rinse polishing of a polished object to be polished, as will be explained below in detail. Therefore, the surface treatment composition according to an embodiment of the present invention is used as a composition for cleaning or a composition for rinse polishing.

According to the present specification, the "layer containing tungsten" may be simply referred to as "tungsten layer" or "W layer", the "polished object to be polished having a layer containing tungsten" may be simply referred to as "polished object to be polished", and the "surface treatment composition according to an embodiment of the present invention" may be simply referred to as "surface treatment composition".

The cleaning process that is carried out after a chemical mechanical polishing (CMP) process is carried out for the purpose of removing any defects (foreign materials such as particles, metal contaminants, organic residues, and pad wastes) remaining on the surface of a semiconductor substrate (polished object to be polished). At this time, for example, these foreign materials can be removed by performing cleaning using the cleaning agent disclosed in WO 2013/162020 A (corresponding to US 2015/140820 A). However, the inventors of the present invention found that when a polished object to be polished having a tungsten layer is cleaned using such a cleaning agent, the effect of suppressing dissolution of the tungsten layer is not sufficient. Then, the inventors conducted a thorough investigation, and as a result, the inventors found that when a surface treatment is carried out using the surface treatment composition according to an embodiment of the present invention, dissolution of the tungsten layer included at the surface of a polished object to be polished is effectively suppressed.

The surface treatment composition according to an embodiment of the present invention contains a tungsten etching inhibitor and water, and the tungsten etching inhibitor is a compound containing a monocyclic or fused polycyclic aromatic hydrocarbon ring having two or more substituents, while the substituents contain at least a nitrogen-containing group and an anionic group. The surface treatment composition has a pH of lower than 7.

The inventors of the present invention speculate the mechanism by which the problems described above are solved by the invention, as follows.

It is speculated that the dissolution of the tungsten layer is attributed to the fact that the tungsten layer formed on the surface of a polished object to be polished forms a hydrate ($W_xO_y^{A-}$) with the water included in the cleaning agent (composition used for cleaning) and thereby becomes easily soluble. Such dissolution of the tungsten layer becomes more noticeable when the pH is high (that is, when the cleaning agent is alkaline) or when the potential of the polished object to be polished is high.

In this regard, the surface treatment composition of the invention includes a compound containing a monocyclic or fused polycyclic aromatic hydrocarbon ring having two or more substituents, the substituents including at least a nitrogen-containing group and an anionic group (tungsten etching inhibitor). Since this tungsten etching inhibitor contains an anionic group, the agent is easily soluble in water, and it is speculated that this tungsten etching inhibitor adsorbs to the tungsten layer and then forms a protective film covering the surface of that layer. Specifically, the tungsten etching inhibitor is coordinated by the nitrogen-containing group at the surface of the tungsten layer. Furthermore, since the tungsten etching inhibitor has an aromatic hydrocarbon ring, the agent can be easily oriented, and can easily produce a more compact protective film (anticorrosive film) on the surface of the tungsten layer. Therefore, it is speculated that since a compact protective film is formed on the surface of the tungsten layer, hydration of the tungsten layer is consequently suppressed, and the tungsten etching inhibitor functions as an inhibitor suppressing the dissolution of the tungsten layer (dissolution inhibitor).

Furthermore, it is thought that since the surface treatment composition of the invention has a pH of lower than 7 (acidic), the dissolution of the tungsten layer that becomes noticeable when the pH is high, can be suppressed.

As such, dissolution of the tungsten layer can be suppressed by using the surface treatment composition of the invention. That is, according to the invention, a means capable of suppressing the dissolution of a layer containing tungsten that is included in a polished object to be polished, when a surface treatment is carried out, is provided. Meanwhile, the mechanism described above is based on speculations, and it should not be construed such that the right or wrong of the speculations may affect the technical scope of the present invention.

Hereinafter, the invention will be explained. The invention is not intended to be limited only to the following embodiments. Furthermore, according to the present specification, unless particularly stated otherwise, the operations and measurement of physical properties and the like are carried out under the conditions of room temperature (from 20° C. to 25° C.)/a relative humidity of from 40% RH to 50% RH.

<Surface Treatment Composition>
[Tungsten Etching Inhibitor]

The surface treatment composition according to an embodiment of the present invention includes a tungsten etching inhibitor. This tungsten etching inhibitor contributes to suppression of the dissolution of the tungsten layer, as explained above.

Furthermore, the tungsten etching inhibitor can also contribute to the suppression of an increase in the surface roughness (increase in the value of the average surface roughness Ra) of the polished object to be polished, more specifically, the tungsten layer, when a surface treatment is carried out. It is thought that an increase in the surface roughness of the tungsten layer is attributed to grain boundary corrosion. In regard to such grain boundary corrosion, when the tungsten etching inhibitor suppresses the dissolution of the tungsten layer as explained above, the tungsten etching inhibitor also suppresses the dissolution of the tungsten layer at the grain boundaries at the same time by suppressing the dissolution of the tungsten layer. It is believed that as a result, flatness of the tungsten layer surface is satisfactorily maintained.

The tungsten etching inhibitor according to the invention is a compound containing a monocyclic or fused polycyclic aromatic hydrocarbon ring having two or more substituents, and the substituents include at least a nitrogen-containing group and an anionic group.

Examples of a monocyclic aromatic hydrocarbon ring include a benzene ring. Examples of a fused polycyclic aromatic hydrocarbon ring include a naphthalene ring, an azulene ring, an anthracene ring, a phenanthrene ring, a pyrene ring, a chrysene ring, a naphthacene ring, a triphenylene ring, an acenaphthene ring, a coronene ring, a fluorene ring, a fluoranthene ring, a naphthacene ring, a pentacene ring, a perylene ring, a pentaphene ring, a picene ring, a pyranthrene ring, and an anthranthrene ring. The tungsten etching inhibitor may contain one kind or two or more kinds of these aromatic hydrocarbon rings.

Among these, a benzene ring or a naphthalene ring is preferred from the viewpoint of the compactness of the anticorrosive film at the tungsten layer surface.

The aromatic hydrocarbon ring has two or more substituents including at least a nitrogen-containing group and an anionic group. Examples of the nitrogen-containing group include amino groups such as a primary amino group (—$NH_2$), a secondary amino group (—NHR), and a tertiary amino group (—NRR'); a nitro group (—$NO_2$); and a cyano group (—CN). The aromatic hydrocarbon ring may contain one kind or two or more kinds of these nitrogen-containing groups. The number of the nitrogen-containing groups may be one, or two or more.

Among these, an amino group or a nitro group is preferred since these groups have a cation charge in the polishing composition.

Examples of an anionic group include a phosphoric acid group (—OPO₃H₂) or a phosphoric acid salt group, a phosphonic acid group (—PO₃H₂) or a phosphonic acid salt group, a phosphinic acid group (=PO₂H) or a phosphinic acid salt group, a sulfuric acid group (—OSO₃H) or a sulfuric acid salt group, a sulfonic acid group (—SO₃H) or a sulfonic acid salt group, a sulfinic acid group (—SO₂H) or a sulfinic acid salt group, a carboxylic acid group (—COOH) or a carboxylic acid salt group. The aromatic hydrocarbon ring may contain one kind or two or more kinds of these anionic groups. The number of the anionic groups may be one, or two or more.

In the following description, a phosphoric acid group (—OPO₃H₂) or a group of a salt thereof (phosphate group, —OPO₃ [M²]₂; here, M² represents an organic or inorganic cation) is described as "phosphoric acid (salt) group". A phosphonic acid group or a phosphonic acid salt group is described as "phosphonic acid (salt) group", a phosphinic acid group or a phosphinic acid salt group is described as "phosphinic acid (salt) group", a sulfuric acid group or a sulfuric acid salt group is described as "sulfuric acid (salt) group", a sulfonic acid group or a sulfonic acid salt group is described as "sulfonic acid (salt) group", a sulfinic acid group or a sulfinic acid salt group is described as "sulfinic acid (salt) group", and a carboxylic acid group or a carboxylic acid salt group is described as "carboxylic acid (salt) group".

Among these, from the viewpoint of solubility in an acidic environment, a carboxylic acid (salt) group, a sulfonic acid (salt) group, a phosphonic acid (salt) group, and a phosphoric acid (salt) group are preferred, and a carboxylic acid (salt) group is more preferred.

The aromatic hydrocarbon ring may also have a substituent other than the nitrogen-containing group and the anionic group described above. Examples of such other group include a linear or branched alkyl group having from 1 to 10 carbon atoms (an alkyl group such as a methyl group, an ethyl group, a propyl group, an isopropyl group, a butyl group, an isobutyl group, a sec-butyl group, or a tert-butyl group); a linear or branched alkoxy group having from 1 to 10 carbon atoms (for example, a methoxy group, an ethoxy group, a propoxy group, an isopropoxy group, a butoxy group, a pentyloxy group, a hexyloxy group, a 2-ethylhexyloxy group, an octyloxy group, or a dodecyloxy group); an aryl group having from 6 to 30 carbon atoms (for example, a phenyl group, a biphenyl group, a 1-naphthyl group, or a 2-naphthyl group); a cycloalkyl group having from 3 to 20 carbon atoms (for example, a cyclopropyl group, a cyclobutyl group, a cyclopentyl group, a cyclohexyl group, or a cycloheptyl group); a thiol group (—SH); a hydroxy group (—OH); a fluorine atom (F); a chlorine atom (Cl); a bromine atom (Br); and an iodine atom (I). The aromatic hydrocarbon ring may have one kind or two or more kinds of these other substituents.

More specific examples of the tungsten etching inhibitor that is suitable used in the surface treatment composition according to an embodiment of the present invention include m-aminobenzoic acid, p-aminobenzoic acid, 3,4-diaminobenzoic acid, p-aminosalicylic acid, 3-amino-4-methylbenzoic acid, 2-amino-4-methylbenzoic acid, 2-amino-6-methylbenzoic acid, 2-amino-3-methylbenzoic acid, 2-amino-5-methylbenzoic acid, 4-amino-2-methylbenzoic acid, 4-amino-3-methylbenzoic acid, 2-amino-3-methoxybenzoic acid, 4-amino-2-methoxybenzoic acid, 3-amino-4-methoxybenzoic acid, 4-amino-2-methoxybenzoic acid, 4-amino-3-methoxybenzoic acid, 2-amino-4,5-dimethoxybenzoic acid, 2-amino-1-naphthoic acid, 3-amino-1-naphthoic acid, 4-amino-1-naphthoic acid, 5-amino-1-naphthoic acid, 6-amino-1-naphthoic acid, 7-amino-1-naphthoic acid, 8-amino-1-naphthoic acid, 1-amino-2-naphthoic acid, 3-amino-2-naphthoic acid, 4-amino-2-naphthoic acid, 5-amino-2-naphthoic acid, 6-amino-2-naphthoic acid, 7-amino-2-naphthoic acid, 8-amino-2-naphthoic acid, 2-aminoterephthalic acid, 2,5-diaminoterephthalic acid, 5-aminoisophthalic acid hydrate, sodium 2-aminobenzoate, sodium 3-aminobenzoate, sodium 4-aminobenzoate, sodium 3,5-diaminobenzoate, sodium 4-aminosalicylate, potassium 2-aminobenzoate, potassium 3-aminobenzoate, potassium 4-aminobenzoate, potassium 3,5-diaminobenzoate, potassium 4-aminosalicylate, 2-nitrobenzoic acid, 3-nitrobenzoic acid, 4-nitrobenzoic acid, 3-methyl-4-nitrobenzoic acid, 2-methyl-3-nitrobenzoic acid, 4-methyl-3-nitrobenzoic acid, 2-methyl-6-nitrobenzoic acid, 3-methyl-2-nitrobenzoic acid, 2-methyl-5-nitrobenzoic acid, 5-methyl-2-nitrobenzoic acid, 2-cyanobenzoic acid, 3-cyanobenzoic acid, 4-cyanobenzoic acid, 4-hydroxy-3-nitrobenzoic acid, 5-hydroxy-2-nitrobenzoic acid, 3-hydroxy-4-nitrobenzoic acid, 3-hydroxy-2-nitrobenzoic acid, 2-hydroxy-4-nitrobenzoic acid, 2-hydroxy-5-nitrobenzoic acid, 4-aminobenzenesulfonic acid, 8-aminonaphthalene-2-sulfonic acid, 8-hydroxynaphthalene-1-sulfonic acid, 4-amino-5-hydroxynaphthalene-2,7-disulfonic acid, 7-aminonaphthalene-1,3,6-trisulfonic acid, 4-aminophenylphosphoric acid, 4-aminophenylphosphonic acid, 4-aminophenylphosphinic acid, 2-aminophenylphosphoric acid, 2-aminophenylphosphonic acid, 2-aminophenylphosphinic acid, 2,6-diaminophenylphosphoric acid, 2,6-diaminophenylphosphonic acid, 2,6-diaminophenylphosphinic acid, 2-amino-4-hydroxyphenylphosphoric acid, 2-amino-4-hydroxyphenylphosphonic acid, 2-amino-4-hydroxyphenylphosphinic acid, 2-amino-1-naphthylphosphoric acid, 2-amino-1-naphthylphosphonic acid, 2-amino-1-naphthylphosphinic acid, 4-amino-1-naphthylphosphoric acid, 4-amino-1-naphthylphosphonic acid, 4-amino-1-naphthylphosphinic acid, 5-amino-2-naphthylphosphoric acid, 5-amino-2-naphthylphosphonic acid, 5-amino-2-naphthylphosphinic acid, 4-amino-3-hydroxy-1-naphthylphosphoric acid, 4-amino-3-hydroxy-1-naphthylphosphonic acid, 4-amino-5-hydroxy-1-naphthylphosphoric acid, 4-amino-5-hydroxy-1-naphthylphoshponic acid, 7-amino-3-hydroxy-2-naphthylphosphoric acid, 7-amino-3-hydroxy-2-naphthylphosphonic acid, 5-dimethylaminonaphthylphosphoric acid, and 5-dimethylamino-2-naphthylphosphonic acid.

Furthermore, also from the viewpoint of reducing defects, it is preferable that the tungsten etching inhibitor has a plurality of amino groups or carboxylic acid groups in one molecule.

Specific examples of a compound having a plurality of amino groups in one molecule include 3,4-diaminobenzoic acid, 2,5-diaminoterephthalic acid, potassium 3,5-diaminobenzoate, 2,6-diaminophenylphosphoric acid, 2,6-diaminophenylphosphonic acid, and 2,6-diaminophenylphosphinic acid.

Specific examples of a compound having a plurality of carboxylic acid groups in one molecule include 2-aminoterephthalic acid, 2,5-diaminoterephthalic acid, and 5-aminoisophthalic acid hydrate.

Among them, when the effect of suppressing dissolution of the tungsten layer, easy availability, and the like are taken into consideration, it is more preferable that the tungsten etching inhibitor includes at least one selected from the group consisting of 3-amino-4-methylbenzoic acid, 5-aminoisophthalic acid hydrate, 3,4-diaminobenzoic acid, sodium 3-aminobenzoate, and 3-nitrobenzoic acid.

Meanwhile, the tungsten etching inhibitor may be used singly or in combination of two or more kinds thereof.

The content (concentration) (in a case in which two or more kinds exist, the total amount) of the tungsten etching inhibitor is not particularly limited; however, it is preferable that the content is 0.01 g/kg or more with respect to the total amount of the surface treatment composition. When the content (concentration) of the tungsten etching inhibitor is 0.01 g/kg or more, the effect of suppressing dissolution of the tungsten layer and the like is enhanced.

From the same point of view, the content (concentration) of the tungsten etching inhibitor is preferably 0.02 g/kg or more, more preferably 0.05 g/kg or more, even more preferably 0.06 g/kg or more, still more preferably 0.08 g/kg or more, particularly preferably 0.1 g/kg or more, and most preferably 0.5 g/kg or more, with respect to the total amount of the surface treatment composition. Furthermore, the content (concentration) of the tungsten etching inhibitor is preferably 15 g/kg or less with respect to the total amount of the surface treatment composition. When the content (concentration) of the tungsten etching inhibitor is 15 g/kg or less, removal of the tungsten etching inhibitor itself after a surface treatment is facilitated. From the same point of view, the content of the tungsten etching inhibitor is more preferably 12 g/kg or less, even more preferably 8 g/kg or less, still more preferably 5 g/kg or less, particularly preferably 3 g/kg or less, and most preferably 2 g/kg or less, with respect to the total amount of the surface treatment composition.

Regarding the tungsten etching inhibitor, the molecular weight is preferably less than 1,000. When the molecular weight is less than 1,000, during the operation of surface-treating the polished object to be polished and then removing the tungsten etching inhibitor, it is easy to remove the tungsten etching inhibitor, which is preferable. From the same point of view, the molecular weight of the tungsten etching inhibitor is more preferably 800 or less, and particularly preferably 600 or less. Meanwhile, the lower limit of the molecular weight of the tungsten etching inhibitor is not particularly limited; however, the lower limit is preferably 120 or more. The molecular weight of the tungsten etching inhibitor can be measured by mass spectrometry (MS) methods such as a gas chromatography-mass spectrometry (GC-MS) and an HPLC-tandem quadrupole mass spectrometry; high performance liquid chromatography (HPLC) methods; and the like.

[pH]

The pH of the surface treatment composition according to an embodiment of the present invention is lower than 7. When the pH is lower than 7, the formation of a tungsten hydrate is suppressed, and dissolution of the tungsten layer can be further suppressed. On the other hand, when the pH is 7 or higher, a tungsten hydrate can be formed more easily, and the tungsten layer is dissolved. Furthermore, from the viewpoint of further suppressing the dissolution of the tungsten layer, the pH is more preferably 4 or lower, even more preferably lower than 4, still more preferably 3 or lower, particularly preferably lower than 3, and most preferably 2.5 or lower. Also, the pH is preferably 1 or higher, and more preferably 1.5 or higher. When the pH is 1 or higher, the amount of addition of an acid for adjusting the pH to a low value can be reduced, and thus it is preferable from the viewpoint of reducing the cost.

As will be explained in detail below, by adjusting the pH of the surface treatment composition to be lower than 7 (that is, making the surface treatment composition acidic), the surface of the polished object to be polished or the surface of any foreign material can be positively charged, and due to electrostatic repulsion, a sufficient effect of removing a foreign material can be obtained. The pH of the surface treatment composition can be checked by using a pH meter (manufactured by HORIBA, Ltd., trade name: LAQUA (registered trademark)).

When the pH is adjusted, it is desirable that any component other than the essential components of the surface treatment composition according to an embodiment of the present invention is not added as far as possible, because such a component may cause generation of a foreign material. Therefore, it is preferable that the surface treatment composition is produced using only the tungsten etching inhibitor, water, and an acid and a polymer compound having a sulfonic acid (salt) group, which are added as necessary. However, in a case in which it is difficult to obtain a desired pH by using these components only, the pH may also be adjusted by using other additives such as an alkali that can be optionally added, to the extent that the effects of the invention are not impaired.

[Dispersing Medium]

The surface treatment composition according to an embodiment of the present invention essentially includes water as a dispersing medium (solvent). A dispersing medium has a function of dispersing or dissolving various components. It is preferable that the dispersing medium is composed of water only; however, for the dispersion or dissolution of various components, the dispersing medium may be a mixed solvent of water and an organic solvent. In this case, examples of the organic solvent to be used include acetone, acetonitrile, ethanol, methanol, isopropanol, glycerin, ethylene glycol, and propylene glycol, which are organic solvents that are miscible with water. It is also acceptable that these organic solvents are used, without mixing with water, to disperse or dissolve various components, and then the resulting dispersion or solution may be mixed with water. These organic solvents can be used singly or in combination of two or more kinds thereof.

Regarding the water, from the viewpoint of preventing contamination of the polished object to be polished (object to be cleaned) or inhibition of the action of other components, water that does not contain impurities as far as possible is preferred. For example, water having a total content of transition metal ions of 100 ppb or less is preferred. Here, the purity of water can be increased by, for example, operations such as removal of impurity ions using an ion exchange resin, removal of foreign materials using a filter, and distillation. Specifically, regarding the water, it is preferable to use, for example, deionized water (ion-exchanged water), pure water, ultrapure water, or distilled water.

[Water-Soluble Polymer]

It is preferable that the surface treatment composition according to an embodiment of the present invention further includes a water-soluble polymer. A water-soluble polymer contributes to the removal of foreign materials using the surface treatment composition. Therefore, a surface treatment composition including a water-soluble polymer can sufficiently remove defects (foreign materials) remaining on the surface of a polished object to be polished during a surface treatment (cleaning or the like) of the polished object to be polished.

Examples of the water-soluble polymer include a polymer compound having a sulfonic acid (salt) group; a polymer compound having a phosphoric acid (salt) group; a polymer compound having a phosphonic acid (salt) group; a polymer compound having a carboxylic acid (salt) group; a water-soluble polymer containing a nitrogen atom, such as polyvinylpyrrolidone (PVP), polyvinylimidazole (PVI), polyvinylcarbazole, polyvinylcaprolactam, polyvinylpiperidine, or polyacryloylmorpholine (PACMO); polyvinyl alcohol (PVA); and hydroxyethyl cellulose (HEC).

Among these, a polymer compound having a sulfonic acid (salt) group is preferred. In the following description, a polymer compound having a sulfonic acid (salt) group will be explained.

<Polymer Compound Having Sulfonic Acid (Salt) Group>

In regard to the surface treatment composition according to an embodiment of the present invention, it is preferable that the water-soluble polymer is a polymer compound having a sulfonic acid (salt) group. A polymer compound having a sulfonic acid (salt) group (in the present specification, also simply referred to as "sulfonic acid group-containing polymer") can contribute more easily to the removal of foreign materials using the surface treatment composition. Therefore, a surface treatment composition including the above-mentioned sulfonic acid group-containing polymer has an effect that during a surface treatment (cleaning or the like) of a polished object to be polished, the defects (foreign materials) remaining on the surface of the polished object to be polished can be removed more easily.

This sulfonic acid group-containing polymer can form micelles, owing to the affinity between the part other than sulfonic acid (salt) groups (that is, the polymer chain part of the sulfonic acid group-containing polymer) and foreign materials (particularly, hydrophobic components). Accordingly, it is conceived that as these micelles are dissolved or dispersed in the surface treatment composition, foreign materials that are hydrophobic components can also be effectively removed.

Furthermore, under acidic conditions, when the surface of the polished object to be polished is cationic, the sulfonic acid (salt) groups become anionic and thereby become easily adsorbable to the surface of the polished object to be polished. As a result, it is thought that the surface of the polished object to be polished is in a state of being covered with the sulfonic acid group-containing polymer. On the other hand, since the sulfonic acid (salt) groups of the sulfonic acid group-containing polymer are easily adsorbable to the remaining foreign materials (particularly, substances that are prone to be cationic), the surface of the foreign materials is anionically charged. Therefore, the foreign materials whose surface has become anionic, and the anionized sulfonic acid (salt) groups of the sulfonic acid group-containing polymer that has adsorbed to the surface of the polished object to be polished, electrostatically repel each other. Furthermore, when the foreign materials are anionic, the foreign materials themselves and the anionized sulfonic acid (salt) groups existing on the polished object to be polished, electrostatically repel each other. Therefore, it is thought that foreign materials can be effectively removed by utilizing such electrostatic repulsion.

Furthermore, it is speculated that in a case in which it is difficult for the polished object to be polished to be electrically charged, foreign materials are removed by mechanisms different from the mechanism described above. First, it is thought that on a hydrophobic polished object to be polished, foreign materials (particularly, hydrophobic components) are in a state of being easily attachable to the polished object to be polished by a hydrophobic interaction. Here, the polymer chain part (hydrophobic structural site) of a sulfonic acid group-containing polymer faces, due to its hydrophobicity, toward the surface side of the polished object to be polished, and the anionized sulfonic acid (salt) groups and the like, which are hydrophobic structural sites, face toward a side opposite to the surface side of the polished object to be polished. It is speculated that the surface of the polished object to be polished is thereby brought into a state of being covered with anionized sulfonic acid (salt) groups and becomes hydrophilic. It is thought that as a result, a hydrophobic interaction between foreign materials (particularly, hydrophobic components) and the polished object to be polished does not easily occur, and adhesion of the foreign materials is suppressed.

The tungsten etching inhibitor and the sulfonic acid group-containing polymer that have adsorbed to the surface of a polished object to be polished are easily removed by further performing washing with water or the like.

The sulfonic acid group-containing polymer is not particularly limited as long as the polymer has a plurality of sulfonic acid (salt) groups, and any known compound can be used. Examples of the sulfonic acid group-containing polymer include a polymer compound obtainable by sulfonating a polymer compound that serves as a base, and a polymer compound obtainable by (co)polymerizing a monomer(s) having a sulfonic acid (salt) group.

More specific examples include a sulfonic acid (salt) group-containing polyvinyl alcohol (sulfonic acid-modified polyvinyl alcohol); a sulfonic acid (salt) group-containing polystyrene such as polystyrenesulfonic acid or sodium polystyrenesulfonate; a sulfonic acid (salt) group-containing polyvinyl acetate (sulfonic acid-modified polyvinyl acetate); a sulfonic acid (salt) group-containing polyester; and a copolymer of a (meth)acrylic group-containing monomer and a sulfonic acid (salt) group-containing monomer, such as a copolymer of (meth)acrylic acid and a sulfonic acid (salt) group-containing monomer. Meanwhile, according to the present specification, the description "(meth)acryl" in the specific names of compounds represents "acryl" and "methacryl", and the description "(meth)acrylate" represents "acrylate" and "methacrylate". The sulfonic acid group-containing polymer can be used singly or in combination of two or more kinds thereof. At least a portion of the sulfonic acid groups carried by these polymers may be in the form of salt. Examples of the salt include alkali metal salts such as sodium salt and potassium salt; salts of Group 2 elements, such as calcium salt and magnesium salt; amine salts; and ammonium salts. Particularly, when the polished object to be polished is a semiconductor substrate after a CMP process, an ammonium salt is preferred from the viewpoint of removing metals on the substrate surface as much as possible.

Furthermore, when the sulfonic acid group-containing polymer is a sulfonic acid (salt) group-containing polyvinyl alcohol, the degree of saponification is preferably 80% or higher, and preferably 85% or higher (upper limit is 100%), from the viewpoint of solubility.

According to the invention, the weight average molecular weight of the sulfonic acid group-containing polymer is preferably 1,000 or more. When the weight average molecular weight is 1,000 or more, the effect of removing foreign materials is further enhanced. Regarding the reason, it is speculated to be because the coatability of the sulfonic acid group-containing polymer needed at the time of covering a polished object to be polished or a foreign material is improved, and the action of removing a foreign material from the surface of a polished object to be polished (object to be cleaned) or the action of suppressing re-adhesion of an organic substance residue to the surface of a polished object to be polished is further enhanced. From the same point of view, the weight average molecular weight is more preferably 2,000 or more, and even more preferably 8,000 or more.

The weight average molecular weight of the sulfonic acid group-containing polymer is preferably 100,000 or less. When the weight average molecular weight is 100,000 or less, the effect of removing foreign materials is further enhanced. Regarding the reason, it is speculated to be because removability of the sulfonic acid group-containing polymer after a cleaning process is further improved. From the same point of view, the weight average molecular weight is more preferably 50,000 or less, even more preferably 40,000 or less, still more preferably 30,000 or less, and particularly preferably 20,000 or less.

The weight average molecular weight can be measured by gel permeation chromatography (GPC), and specifically, the weight average molecular weight can be measured by the method described in Examples.

The content (concentration) of the sulfonic acid group-containing polymer is preferably 0.01 g/kg or more with respect to the total amount of the surface treatment composition. When the content (concentration) of the sulfonic acid group-containing polymer is 0.01 g/kg or more, the effect of removing foreign materials is further enhanced. Regarding the reason, it is speculated to be because when the sulfonic acid group-containing polymer covers the polished object to be polished and foreign materials, the covering can be achieved in a larger area. Thereby, foreign materials in particular can easily form micelles, and therefore, the effect of removing foreign materials by dissolution or dispersion of the micelles is enhanced. Furthermore, it is speculated to be because an increase in the number of sulfonic acid (salt) groups leads to a stronger manifestation of an electrostatic adsorption or repulsion effect. From the same point of view, the content (concentration) of the sulfonic acid group-containing polymer is preferably 0.03 g/kg or more, and more preferably 0.05 g/kg or more, with respect to the total amount of the surface treatment composition. Furthermore, it is preferable that the content of the sulfonic acid group-containing polymer is 5 g/kg or less with respect to the total amount of the surface treatment composition. When the content of the sulfonic acid group-containing polymer is 5 g/kg or less, the effect of removing foreign materials is further enhanced. This is speculated to be because the removability of the sulfonic acid group-containing polymer itself after a cleaning process is improved. From the same point of view, the content of the sulfonic acid group-containing polymer is more preferably 3 g/kg or less, even more preferably 2 g/kg or less, and particularly preferably 1 g/kg or less, with respect to the total amount of the surface treatment composition.

The surface treatment composition according to an embodiment of the present invention may also include a polymer compound other than the water-soluble polymer. At this time, the content of the sulfonic acid group-containing polymer is preferably more than 80% by mass with respect to the total mass of the polymer compounds included in the surface treatment composition (upper limit 100% by mass). When the content of the sulfonic acid group-containing polymer is more than 80% by mass with respect to the total mass of the polymer compounds included in the surface treatment composition, the effect of removing foreign materials is further improved. This is because the amount of a polymer compound other than the sulfonic acid group-containing polymer, which may cause generation of foreign materials after a cleaning process, can be reduced. Furthermore, it is speculated to be because when the sulfonic acid group-containing polymer covers a polished object to be polished and a foreign material, the possibility that the polymer compound other than the sulfonic acid group-containing polymer may interrupt the covering by the sulfonic acid group-containing polymer is suppressed. From the same point of view, the content of the sulfonic acid group-containing polymer is more preferably more than 95% by mass with respect to the total mass of the polymer compounds included in the surface treatment composition. In such a case, the effect of removing foreign materials is markedly improved.

In the present specification, the term "polymer compound" refers to a compound having a weight average molecular weight of 1,000 or more.

Furthermore, it is particularly preferable that the content of the sulfonic acid group-containing polymer is 100% by mass with respect to the total mass of the polymer compounds included in the surface treatment composition. That is, it is particularly preferable that the polymer compound included in the surface treatment composition is the sulfonic acid group-containing polymer only.

[Acid]

It is preferable that the surface treatment composition according to an embodiment of the present invention further includes an acid. According to the present specification, the sulfonic acid group-containing polymer is handled as a component that is different from the acid as the additive as used herein. An acid is added mainly for the purpose of adjusting the pH of the surface treatment composition. As explained above, dissolution of tungsten and the like can be suppressed by adjusting the pH of the surface treatment composition to be lower than 7 (acidifying the surface treatment composition). Furthermore, in regard to the acid, it is speculated that when the polished object to be polished contains silicon nitride, silicon oxide, or polysilicon, the acid plays the role of positively charging the surface of the polished object to be polished or the surface of foreign materials. Therefore, when an acid is added, the electrostatic repulsion effect is further promoted, and the effect of removing foreign materials by using the surface treatment composition is further enhanced.

Regarding the acid, any one of an inorganic acid and an organic acid may be used. The inorganic acid is not particularly limited; however, examples include sulfuric acid, nitric acid, boric acid, carbonic acid, hypophosphorous acid, phosphorous acid, and phosphoric acid. The organic acid is not particularly limited; however, examples include carboxylic acids such as formic acid, acetic acid, propionic acid, butyric acid, valeric acid, 2-methylbutyric acid, n-hexanoic acid, 3,3-dimethylbutyric acid, 2-ethylbutyric acid, 4-methylpentanoic acid, n-heptanoic acid, 2-methylhexanoic acid, n-octanoic acid, 2-ethylhexanoic acid, benzoic acid, glycolic acid, salicylic acid, glyceric acid, oxalic acid, malonic acid, succinic acid, glutaric acid, adipic acid, pimellic acid, maleic acid, phthalic acid, malic acid, tartaric acid, citric acid, and lactic acid; methanesulfonic acid, ethanesulfonic acid, and isethionic acid.

Among these, from the viewpoint that the effect of positively charging the surface of the polished object to be polished and the surface of foreign materials is further improved, and the removability of foreign materials is increased, it is more preferable that the acid is maleic acid or nitric acid, and it is even more preferable that the acid is maleic acid.

The acids can be used singly or in combination of two or more kinds thereof.

The content of the acid is not particularly limited as long as the content is an amount with which the pH of the surface treatment composition is in the range described above; however, for instance, it is preferable that the content is 0.01% by mass or more with respect to the total mass of the surface treatment composition. When the content of the acid is 0.01% by mass or more, the effect of removing foreign materials is further improved. This is speculated to be because the effect of positively charging the surface of the polished object to be polished and the surface of foreign materials is further improved. From the same point of view, the content of the acid is preferably 0.02% by mass or more, more preferably 0.03% by mass or more, even more preferably 0.05% by mass or more, and particularly preferably 0.1% by mass or more, with respect to the total mass of the surface treatment composition. Furthermore, the content of the acid is preferably 5% by mass or less with respect to the total mass of the surface treatment composition. When the content of the acid is 5% by mass or less, it is preferable from the viewpoint of reducing the cost. From the same point of view, the content of the acid is more preferably 3% by mass or less, and even more preferably 1% by mass or less, with respect to the total mass of the surface treatment composition.

[Other Additives]

The surface treatment composition according to an embodiment of the present invention may also include, if necessary, other additives at any arbitrary proportions to the extent that the effects of the invention are not impaired. However, since components other than the essential components of the surface treatment composition according to an embodiment of the present invention may cause generation of foreign materials, it is desirable that those additives are not added as far as possible. Therefore, it is preferable that regarding the components other than the essential components, the amounts of addition thereof are as small as possible, and it is more preferable that those components are not incorporated. Examples of the other additives include abrasive grains, an alkali, an antiseptic agent, dissolved gas, a reducing agent, an oxidizing agent, and an alkanolamine. Among them, for further improvement of the foreign material removing effect, it is preferable that the surface treatment composition substantially does not include abrasive grains. Here, the phrase "substantially does not include abrasive grains" means that the content of abrasive grains with respect to the entire surface treatment composition is 0.01% by mass or less.

[Effect of Suppressing Dissolution of Tungsten Layer]

The surface treatment composition according to an embodiment of the present invention is such that it is more preferable as the effect of suppressing dissolution of the tungsten layer of the polished object to be polished is higher. In addition, it is more preferable as the surface treatment composition according to an embodiment of the present invention has a higher effect of suppressing an increase in the surface roughness of the polished object to be polished.

In regard to the effect of suppressing dissolution of the tungsten layer, it is more preferable as the etching rate for the tungsten layer is lower when a surface treatment of a polished object to be polished is carried out using the surface treatment composition. Specifically, when a polished object to be polished is surface-treated using the surface treatment composition, it is preferable that the film thickness dissolved per 30 minutes is 50 Å (5 nm; 10 Å=1 nm, hereinafter, the same) or less, more preferably 45 Å (4.5 nm) or less, even more preferably 40 Å (4 nm) or less, still more preferably 30 Å (3 nm) or less, particularly preferably 20 Å (2 nm) or less, and most preferably 10 Å (1 nm) or less. Meanwhile, since it is more preferable that the etching rate is lower, the lower limit is not particularly limited; however, substantially, the film thickness dissolved per 30 minutes is 0.1 Å (0.01 nm).

Furthermore, in regard to the effect of suppressing an increase in the surface roughness of the tungsten layer, it is more preferable as the average surface roughness (Ra) of the polished object to be polished obtainable after performing a surface treatment of the polished object to be polished using the surface treatment composition is smaller. Specifically, the average surface roughness obtainable after surface-treating the polished object to be polished using the surface treatment composition is preferably 12.5 Å or less, more preferably 10 Å or less, and particularly preferably 5 Å or less. Meanwhile, since it is more preferable as the average surface roughness is smaller, the lower limit is not particularly limited; however, the average surface roughness is substantially 0.1 Å.

Regarding the value of the etching rate, a value obtained by performing a surface treatment by the method described in the Examples and then making a measurement by the method described in the Examples is employed.

[Foreign Material Removing Effect]

In regard to the surface treatment composition according to an embodiment of the present invention, it is more preferable as the effect of removing foreign materials on the surface of the polished object to be polished is superior. That is, when a surface treatment of a polished object to be polished is carried out using the surface treatment composition, it is more preferable as the number of foreign materials remaining on the surface is smaller. Specifically, when a polished object to be polished is surface-treated using the surface treatment composition, it is preferable that the number of foreign materials is 6,000 or less, more preferably 3,000 or less, even more preferably 2,000 or less, still more preferably 1,500 or less, particularly preferably 1,000 or less, and most preferably 200 or less. Meanwhile, since it is more preferable as the number of the foreign materials is smaller, the lower limit of the number of foreign materials is not particularly limited; however, the lower limit is substantially 50.

Meanwhile, regarding the number of the foreign materials, a value obtained by performing a surface treatment by the method described in the Examples and then making a measurement by the method described in the Examples, is employed.

<Method for Producing Surface Treatment Composition>

The method for producing the surface treatment composition is not particularly limited, and for example, a method of mixing a tungsten etching inhibitor with water may be used. That is, according to another embodiment of the present invention, a method for producing the surface treatment composition, the method including mixing a tungsten etching inhibitor with water, is also provided. The type, amount of addition, and the like of the tungsten etching inhibitor described above are as described above. Furthermore, in regard to the method for producing a surface treatment composition according to an embodiment of the present invention, if necessary, the water-soluble polymer, acid, other additives, dispersing medium other than water, and the like as described above may be further incorporated. The type, amount of addition, and the like of these components are as described above.

The order of addition and the method of addition of the above-described various components are not particularly limited. The various components may be added all together or separately, stepwise or continuously. Furthermore, the mixing method is also not particularly limited, and any known method can be used. Preferably, the method for producing a surface treatment composition includes sequentially adding a tungsten etching inhibitor, water, and a polymer compound having a sulfonic acid (salt) group that is added as necessary, and stirring the components in water. In addition, the method for producing the surface treatment composition described above may further include measuring and adjusting the pH of the surface treatment composition, so that the pH becomes lower than 7.

<Polished Object to be Polished>

According to the invention, the polished object to be polished (in the present specification, may also be referred to as "object to be cleaned") has a layer containing tungsten. Here, when it is said "the polished object to be polished has a layer containing tungsten", the layer may be in any form as long as the surface that becomes the object to be polished contains tungsten. Therefore, the polished object to be polished may be a substrate formed of tungsten, or a substrate having a layer containing tungsten or a layer formed of tungsten (for example, a substrate formed by disposing a layer containing tungsten or a layer formed of tungsten on a substrate produced from a polymer or another metal). Preferably, the polished object to be polished is a polished object to be polished (for example, a substrate) having a layer formed of tungsten. That is, it is preferable that the surface treatment composition of the invention is used for a surface treatment (rinse polishing, cleaning, or the like) of a polished object to be polished having a layer formed of tungsten.

According to the present specification, a polished object to be polished means an object to be polished after being polished in a polishing process. The polishing process is not particularly limited; however, the polishing process is preferably a CMP process.

The surface treatment composition according to an embodiment of the present invention can effectively reduce foreign materials that remain on the surface of a polished object to be polished containing silicon nitride, silicon oxide, or polysilicon, together with the above-described layer containing tungsten. Examples of the polished object to be polished containing silicon oxide include polished objects to be polished having a tetraethyl orthosilicate (TEOS) type silicon oxide surface (hereinafter, also simply referred to as "TEOS") produced by using tetraethyl orthosilicate as a precursor, a high density plasma (HDP) film, an undoped silicate glass (USG) film, a (phosphorus silicate glass (PSG) film, a boron-phosphor silicate glass (BPSG) film, and a rapid thermal oxidation (RTO) film.

The polished object to be polished is preferably a polished semiconductor substrate, and more preferably a semiconductor substrate obtained after CMP. Here, an increase in the number of foreign materials or surface roughness may cause deterioration of the performance of a semiconductor device. Therefore, when the polished object to be polished is a polished semiconductor substrate, it is preferable that the number of foreign materials or the surface roughness is reduced as far as possible in the cleaning process for a semiconductor substrate. Since the surface treatment composition of the invention has a sufficient effect of removing foreign materials, the surface treatment composition can be suitably used for a surface treatment (cleaning or the like) of such a polished semiconductor substrate.

Specific examples of such a polished object to be polished include a polished semiconductor substrate having a structure in which a silicon nitride film or a silicon oxide film is formed on tungsten, and a polished semiconductor substrate having a structure in which a tungsten portion, a silicon nitride film, and a silicon oxide film are all exposed.

Here, from the viewpoint of the effect provided by the invention, the surface treatment composition according to an embodiment of the invention is suitably used for a surface treatment for a polished object to be polished that contains silicon nitride, silicon oxide, or polysilicon and includes a layer containing tungsten. In regard to the polished object to be polished containing silicon nitride, silicon oxide, or polysilicon, strict removal of foreign materials is required in the production of semiconductor devices; however, since the surface treatment composition according to an embodiment of the present invention has a sufficient ability of removing foreign materials, the surface treatment composition is sufficiently applicable even to such a requirement.

<Surface Treatment Method>

Another embodiment of the present invention is a surface treatment method including surface-treating of a polished object to be polished having a layer containing tungsten, by using the surface treatment composition described above. According to the present specification, a surface treatment method refers to a method of reducing foreign materials on the surface of a polished object to be polished, and this method is a method of performing cleaning in a broad sense.

When the surface treatment method according to an embodiment of the present invention is used, remaining foreign materials can be sufficiently removed while the dissolution of a layer containing tungsten is suppressed. That is, according to another embodiment of the present invention, there is provided a method for reducing a foreign material on the surface of a polished object to be polished, the method including surface-treating the polished object to be polished having a layer containing tungsten by using the surface treatment composition described above.

The surface treatment method according to an embodiment of the present invention is carried out by a method of bringing the surface treatment composition according to the invention into direct contact with a polished object to be polished.

Regarding the surface treatment method, mainly (I) a method based on a rinse polishing treatment and (II) a method based on a cleaning treatment may be mentioned. That is, it is preferable that the surface treatment according to an embodiment of the present invention is carried out by rinse polishing or cleaning. The rinse polishing treatment and the cleaning treatment are carried out in order to obtain a clean surface by removing foreign materials (particles, metal contaminants, organic residues, pad wastes, and the like) on the surface of a polished object to be polished. The above-described items (I) and (II) will be explained below.

(I) Rinse Polishing Treatment

The surface treatment composition according to the invention is suitably used for a rinse polishing treatment. The rinse polishing treatment is carried out on a polishing table (platen) equipped with a polishing pad after the object to be polished is subjected to final polishing (finish polishing), for the purpose of removing foreign materials on the surface of an object to be polished. At this time, the rinse polishing treatment is carried out by bringing the surface treatment composition according to the invention into direct contact with the polished object to be polished. As a result, the foreign materials on the surface of the polished object to be polished are removed by the frictional force (physical action) exerted by the polishing pad and the chemical action caused by the surface treatment composition. Among the foreign materials, particles and organic residues in particular are easily removed by physical action. Therefore, in the rinse polishing treatment, the particles or organic residues can be effectively removed by utilizing the friction between the polished object to be polished and a polishing pad on a polishing table (platen).

Specifically, the rinse polishing treatment can be carried out by positioning the surface of a polished object to be polished obtained after a polishing process on the polishing table (platen) of a polishing apparatus, bringing the polished semiconductor substrate into contact with a polishing pad, and causing the polished object to be polished and the polishing pad to slide relative to each other, while supplying a surface treatment composition (composition for rinse polishing) to the contact portion.

The rinse polishing treatment can also be carried out by using any one of a single-sided polishing apparatus and a both-sided polishing apparatus. Furthermore, it is preferable that the polishing apparatus includes a discharge nozzle for a composition for rinse polishing, in addition to a discharge nozzle for a polishing composition. The operating conditions for the polishing treatment at the time of the rinse polishing treatment are not particularly limited, and any person having ordinary skill can set the conditions as appropriate.

(II) Cleaning Treatment

The surface treatment composition according to the invention is suitably used for a cleaning treatment. The cleaning treatment is carried out, after the object to be polished is subjected to final polishing (finish polishing), or after the rinse polishing treatment is performed, for the purpose of removing foreign materials on the surface of the object to be polished. Meanwhile, the cleaning treatment and the rinse polishing treatment are classified by the place where these treatments are carried out, and the cleaning treatment is a surface treatment that is carried out after a polished object to be polished is dismounted from the polishing table (platen). In the cleaning treatment, too, the surface treatment composition according to the invention can be brought into direct contact with a polished object to be polished, and foreign materials on the surface of the object can be removed.

Examples of the method of performing a cleaning treatment include (i) a method of bringing a cleaning brush into contact with one surface or both surfaces of a polished object to be polished while the polished object to be polished is retained, and rubbing the surface of the polished object to be polished with the cleaning brush while a surface treatment composition is supplied to the contact portion; and (ii) a method of immersing a polished object to be polished into a surface treatment composition, and performing an ultrasonic treatment or stirring (dipping type). In such a method, foreign materials on the surface of the polished object to be polished are removed by a frictional force caused by the cleaning brush or a mechanical force generated by an ultrasonic treatment or stirring, and a chemical action caused by the surface treatment composition.

In regard to the method (i) described above, the method of bringing the surface treatment composition (cleaning composition) into contact with a polished object to be polished is not particularly limited; however, the contacting method may be a spinning method of rotating the polished object to be polished at a high speed while causing the surface treatment composition to flow over the polished object to be polished from a nozzle; and a spraying method of cleaning by spraying the surface treatment composition toward the polished object to be polished.

From the viewpoint that more efficient removal of contaminants in a short time period can be achieved, it is preferable to employ a spinning method or a spraying method, and more preferably a spinning method, for the cleaning treatment.

Examples of an apparatus for performing such a cleaning treatment include a batch type cleaning apparatus that performs simultaneous surface treatments on a plurality of sheets of polished objects to be polished, which are accommodated in a cassette; and a sheet type cleaning apparatus in which one sheet of a polished object to be polished is mounted on a holder and is surface-treated. From the viewpoint of shortening the cleaning time or the like, a method of using a sheet type cleaning apparatus is preferred.

Furthermore, as an apparatus for performing a cleaning treatment, a polishing apparatus including a cleaning facility that detaches the polished object to be polished from the polishing table (platen) and then rubs the polished object to be polished with a cleaning brush, may be used. When such a polishing apparatus is used, the cleaning treatment of the polished object to be polished can be carried out more efficiently.

Regarding such a polishing apparatus, a general polishing apparatus having a holder that retains a polished object to be polished, a motor capable of operating at a variable rotation speed, a cleaning brush, and the like can be used. Regarding the polishing apparatus, any one of a single-sided polishing apparatus or a double-sided polishing apparatus may be used. In addition, in the case of performing a rinse polishing process after a CMP process, it is more efficient and preferable that this cleaning treatment is carried out using an apparatus similar to the polishing apparatus used in the rinse polishing apparatus.

The cleaning brush is not particularly limited; however, preferably, a brush made of a resin is used. The material for the brush made of a resin is not particularly limited; however, for example, polyvinyl alcohol (PVA) may be used. Regarding the cleaning brush, it is more preferable to use a sponge made of PVA.

There are no particular limitations on the cleaning conditions, and the cleaning conditions can be set as appropriate according to the type of the object to be cleaned, and the type and amount of the organic residue as an object to be removed. For example, the rotation speed of the cleaning brush is preferably from 10 rpm (0.17 $s^{-1}$; 60 rpm=1 $s^{-1}$, hereinafter, the same) to 200 rpm (3.3 $s^{-1}$). The rotation speed of the object to be cleaned is preferably from 10 rpm (0.17 $s^{-1}$) to 100 rpm (1.7 $s^{-1}$), and the pressure applied to the object to be cleaned (polishing pressure) is preferably from 0.5 psi (3.4 kPa; 1 psi=6894.76 Pa, hereinafter, the same) to 10 psi (68.9 kPa). The method of supplying the surface treatment composition to the cleaning brush is also not particularly limited, and for example, a method of continuously supplying the surface treatment composition using a pump or the like (constant flow) is employed. The amount of supply of the surface treatment composition is not particularly limited; however, the amount of supply is preferably an amount supply that allows the surfaces of the cleaning brush and the object to be cleaned to be constantly covered with the surface treatment composition, and the amount of supply is more preferably from 10 mL/min to 5,000 mL/min. The cleaning time is not particularly limited; however, in the process of using the surface treatment composition according to an embodiment of the present invention, the cleaning time is preferably from 5 seconds to 180 seconds. When the amount of supply of the surface treatment composition is in such a range, foreign materials can be removed more effectively.

The temperature of the surface treatment composition at the time of cleaning is not particularly limited, and usually, the cleaning temperature is desirably room temperature (25° C.). However, the surface treatment composition may be warmed to a temperature of about from 40° C. to 70° C., to the extent that the performance is not impaired.

In regard to the method (ii) described above, there are no particular limitations on the conditions for the cleaning method based on immersion, and any known technique can be used.

Before, after, or both before and after performing the cleaning treatment according to the method (i) or (ii) described above, it is also acceptable to perform cleaning with water.

Furthermore, it is preferable that the polished object to be polished (object to be cleaned) after cleaning is dried by shaking off the water droplets adhering to the surface by means of a spin dryer or the like. It is also acceptable that the surface of the polished object to be polished (object to be cleaned) is dried by air blow drying.

<Method for Producing Semiconductor Substrate>

The surface treatment method according to an embodiment of the present invention can be suitably applied when the polished object to be polished is a polished semiconductor substrate having a layer containing tungsten. That is, according to another embodiment of the present invention, there is also provided a method for producing a semiconductor substrate, in which the polished object to be polished is a polished semiconductor substrate having a layer containing tungsten and this polished semiconductor substrate is surface-treated using the surface treatment composition.

The details of the semiconductor substrate to which such a production method is applied are as explained above for the polished object to be polished that is surface-treated using the surface treatment composition described above.

Regarding the method for producing a semiconductor substrate, there are no particular limitations as long as the method includes a step of surface-treating the surface of a polished semiconductor substrate having a tungsten layer using the surface treatment composition according to an embodiment of the present invention (surface treatment process). Examples of such a production method include a method including a polishing process and a cleaning process for forming a polished semiconductor substrate having a tungsten layer. Furthermore, as another example, a method including, in addition to the polishing process and the cleaning process, a rinse polishing step between the polishing process and the cleaning process may be mentioned. In the following description, these various processes will be explained.

[Polishing Process]

The polishing process that may be included in the method for producing a semiconductor substrate is a step of forming a polished semiconductor substrate by polishing a semiconductor substrate.

The polishing process is not particularly limited as long as it is a process of polishing a semiconductor substrate; however, the polishing process is preferably a chemical mechanical polishing (CMP) process. Furthermore, the polishing process may be a polishing process composed of a single process, or may be a polishing process including a plurality of processes. Examples of the polishing process that includes a plurality of processes include a process of performing a finish polishing process after a preliminary polishing process (crude polishing process); and a process of performing one time or two or more times of secondary polishing processes after a primary polishing process, and then performing a finish polishing process. It is preferable that the surface treatment process of using the surface treatment composition according to the invention is carried out after the finish polishing process.

Regarding the polishing composition, a known polishing composition can be used as appropriate in accordance with the characteristics of the semiconductor substrate. The polishing composition is not particularly limited; however, for example, a polishing composition including abrasive grains, an acid salt, a dispersing medium, and an acid can be preferably used. Specific examples of such a polishing composition include a polishing composition including sulfonic acid-modified colloidal silica, ammonium sulfate, water, and maleic acid.

Regarding the polishing apparatus, a general polishing apparatus equipped with a holder for retaining an object to be polished, a motor capable of operating at a variable rotation speed, and the like, the polishing apparatus having a polishing table to which a polishing pad (polishing cloth) is attachable, can be used. Regarding the polishing apparatus, any one of a single-sided polishing apparatus or a double-sided polishing apparatus may be used.

Regarding the polishing pad, a general nonwoven fabric, a polyurethane, a porous fluororesin, and the like can be used without any particular limitations. It is preferable that the polishing pad is subjected to grooving for collecting the polishing liquid.

The polishing conditions are not particularly limited, and for example, the rotation speed of the polishing table and the rotation speed of the head (carrier) are preferably from 10 rpm to 100 rpm, and the pressure applied to the object to be polished (polishing pressure) is preferably from 0.5 psi (3.4 kPa) to 10 psi (68.9 kPa). The method for supplying the polishing composition to the polishing pad is also not particularly limited, and for example, a method of continuously supplying the polishing composition with a pump or the like (constant flow) is employed. The amount of supply of the polishing composition is not particularly limited; however, an amount of supply by which the surface of the polishing pad is constantly covered with the polishing composition is preferred, and it is more preferable that the amount of supply is from 10 mL/min to 5,000 mL/min. The polishing time is also not particularly limited; however, in a process of using a polishing composition, the polishing time is preferably from 5 seconds to 180 seconds.

[Surface Treatment Process]

The surface treatment process refers to a step of reducing foreign materials on the surface of a polished object to be polished by using the surface treatment composition according to the invention. In regard to the method for producing a semiconductor substrate, a rinse polishing process and a cleaning process may be carried out as surface treatment processes, only a rinse polishing process may be carried out, or only a cleaning process may be carried out.

(Rinse Polishing Process)

The rinse polishing process may be provided between a polishing process and a cleaning process in the method for producing a semiconductor substrate. The rinse polishing process is a process of reducing foreign materials on the surface of a polished object to be polished (polished semiconductor substrate), by means of the surface treatment method according to an embodiment of the present invention (rinse polishing treatment method).

In regard to the rinse polishing process, regarding the polishing apparatus, polishing pad, conditions for rinse polishing, and the like, apparatuses and conditions similar to the polishing process described above can be applied, except that the surface treatment composition according to the invention is supplied instead of supplying a polishing composition.

The details of the rinse polishing method used in the rinse polishing process are as described above in the explanation related to the rinse polishing treatment described above.

(Cleaning Process)

The cleaning process may be provided after the polishing process, or may be provided after the rinse polishing process, in the method for producing a semiconductor substrate. The cleaning process is a process of reducing foreign materials on the surface of a polished object to be polished (polished semiconductor substrate) by the surface treatment method (cleaning method) according to an embodiment of the present invention.

The details of the cleaning method used in the cleaning process are as described in the explanation related to the cleaning method described above.

Embodiments of the present invention have been described in detail; however, these are only for illustrative purpose and are not limited. It is obvious that the scope of the invention should be definitely construed based on the claims.

The present invention includes the following embodiments.

1. A surface treatment composition having a pH of lower than 7 and used for treating the surface of a polished object to be polished having a layer containing tungsten, the surface treatment composition containing a tungsten etching inhibitor and water, in which the tungsten etching inhibitor is a compound containing a monocyclic or fused polycyclic aromatic hydrocarbon ring having two or more substituents, and the substituents contain at least a nitrogen-containing group and an anionic group;

2. The surface treatment composition described in item 1., in which the aromatic hydrocarbon ring is a benzene ring or a naphthalene ring;

3. The surface treatment composition described in item 1. or 2., in which the nitrogen-containing group is an amino group or a nitro group;

4. The surface treatment composition described in any one of items 1. to 3., in which the anionic group is a carboxylic acid (salt) group;

5. The surface treatment composition described in any one of items 1. to 4., in which the tungsten etching inhibitor contains at least one selected from the group consisting of 3-amino-4-methylbenzoic acid, 5-aminoisophthalic acid hydrate, 3,4-diaminobenzoic acid, sodium 3-aminobenzoate, and 3-nitrobenzoic acid;

6. The surface treatment composition described in any one of items 1. to 5., further including a water-soluble polymer;

7. The surface treatment composition described in item 6., in which the water-soluble polymer is a polymer compound having a sulfonic acid group or a sulfonic acid (salt) group;

8. The surface treatment composition described in any one of items 1. to 7., in which the pH is 4 or lower;

9. The surface treatment composition described in any one of items 1. to 8., in which the composition substantially does not include abrasive grains;

10. A method for producing the surface treatment composition described in any one of items 1. to 9., the method including mixing the tungsten etching inhibitor and the water;

11. A surface treatment method, including surface-treating a polished object to be polished having a layer containing tungsten, using the surface treatment composition described in any one of items 1. to 9.;

12. The surface treatment method described in item 11., in which the surface treatment is carried out by rinse polishing or cleaning; and 13. A method for producing a semiconductor substrate, the method including a surface treatment process of surface-treating a polished object to be polished by means of the surface treatment method described in item 11. or 12., in which the polished object to be polished is a polished semiconductor substrate having a layer containing tungsten.

EXAMPLES

The present invention will be described in more detail using the following Examples and Comparative Examples. However, the technical scope of the present invention is not intended to be limited to the following Examples only. Unless particularly stated otherwise, the units "percent (%)" and "parts" mean "mass %" and "parts by mass", respectively. In the following Examples, unless particularly stated otherwise, operations were carried out under the conditions of room temperature (from 20° C. to 25° C.) and a relative humidity of from 40% RH to 50% RH.

The pH of a surface treatment composition (liquid temperature: 25° C.) was checked using a pH meter (manufactured by HORIBA, Ltd., product name: LAQUA (registered trademark)).

(Molecular Weight of Water-Soluble Polymer)

The weight average molecular weight of a water-soluble polymer was measured under the following measurement conditions.

GPC apparatus: manufactured by SHIMADZU CORPORATION

Type: Prominence

Column: Shim-Pack (Registered trademark) VP-ODS (manufactured by Shimadzu GLC, Ltd.)

Mobile phase A: MeOH

B: 1% aqueous solution of acetic acid

Flow rate: 1 mL/min

Detector: ELSD (Evaporative Light Scattering Detector), (ELSD-LTII) temp. 40° C., Gain 8, $N_2$GAS 350 kPa Oven temperature: 40° C.

Injection amount: 40 μL.

<Production of Surface Treatment Composition>

Example 1

Production of Surface Treatment Composition A-1

3-Amino-4-methylbenzoic acid, which is a tungsten etching inhibitor, was mixed (mixing temperature: 25° C.) with water (deionized water) to a concentration of 1 g/kg, and maleic acid, which is a pH adjusting agent, was added to the mixture so as to adjust the pH to be between 2.0 and 2.3. Thus, surface treatment composition A-1 was produced.

Examples 2 to 5

Production of Surface Treatment Compositions A-2 to A-5

Surface treatment compositions A-2 to A-5 were produced in the same manner as in Example 1, except that the tungsten etching inhibitor was changed to the compounds described in the following Table 1.

Example 6

Production of Surface Treatment Composition A-6

Surface treatment composition A-6 was produced by mixing 3-amino-4-methylbenzoic acid, which is a tungsten etching inhibitor, with water (deionized water) to a concentration of 1 g/kg, mixing polystyrenesulfonic acid (weight average molecular weight: 10,000 to 20,000), which is a water-soluble polymer, with water (deionized water) to a concentration of 1 g/kg, adding maleic acid as a pH adjusting agent, and thereby adjusting the pH to be between 2.0 and 2.3.

Examples 7 to 10

Production of Surface Treatment Composition A-7 to A-10

Surface treatment compositions A-7 to A-10 were produced in the same manner as in Example 6, except that the tungsten etching inhibitor was changed to the compounds described in the following Table 1.

Comparative Example 1

Production of Surface Treatment Composition C-1

Surface treatment composition C-1 was produced in the same manner as in Example 1, except that 3-amino-4-methylbenzoic acid was not used.

Comparative Example 2

Production of Surface Treatment Composition C-2

Surface treatment composition C-2 was produced in the same manner as in Example 6, except that 3-amino-4-methylbenzoic acid was not used.

Comparative Examples 3 to 9

Production of Surface Treatment Compositions C-3 to C-9

Surface treatment compositions C-3 to C-9 were produced in the same manner as in Example 1, except that the tungsten etching inhibitor was changed to the compounds described in the following Table 1.

<Evaluation>

[Evaluation of Number of Defects (Number of Foreign Materials)]

(Preparation of Polished Object to be Polished (Object to be Cleaned))

A polished silicon nitride substrate, which had been polished by a chemical mechanical polishing (CMP) process as described below, was prepared as the polished object to be polished (also referred to as object to be cleaned or polished substrate).

<<CMP Process>>

A silicon nitride substrate, which is a semiconductor substrate, was subjected to polishing using a polishing composition (composition: 4% by mass of sulfonic acid-modified colloidal silica (produced by the method described in "Sulfonic acid-functionalized silica through quantitative oxidation of thiol groups", Chem. Commun., 246-247 (2003), primary particle size 30 nm, secondary particle size 60 nm), 1% by mass of ammonium sulfate, 0.018% bymass of an aqueous solution of maleic acid at a concentration of 30% bymass, solvent: water) under the conditions described below. Here, a 300-mm wafer was used as the silicon nitride substrate.

Polishing Apparatus and Polishing Conditions

Polishing apparatus: F-REX300E manufactured by Ebara Corp.

Polishing pad: Hard polyurethane pad IC1010 manufactured by Nitta Haas, Inc.

Polishing pressure: 2.0 psi (13.8 kPa) (1 psi=6894.76 Pa; hereinafter, the same)

Rotation speed of polishing table: 60 rpm

Rotation speed of head: 60 rpm

Supply of polishing composition: Constant flow

Amount of supply of polishing composition: 300 mL/min

Polishing time: 60 seconds

<<Cleaning Process>>

After the wafer surface was polished in the CMP process, the wafer was removed from the polishing table (platen). Subsequently, in the same polishing apparatus, the polished substrate was cleaned using each of the surface treatment compositions (cleaning compositions) produced as described above, by a cleaning method of sandwiching the wafer between upper and lower sponges made of polyvinyl alcohol (PVA), which were cleaning brushes, and rubbing the polished substrate under the following conditions while pressure was applied to the polished substrate.

Cleaning Apparatus and Cleaning Conditions

Apparatus: F-REX300E manufactured by Ebara Corp.

Rotation speed of cleaning brush: 100 rpm

Rotation speed of object to be cleaned (polished substrate): 50 rpm

Flow rate of cleaning liquid: 1,000 mL/min

Cleaning time: 60 seconds

<<Measurement of Number of Defects (Number of Foreign Materials)>>

For the various cleaned substrates obtained after cleaning by the cleaning process described above, the number of defects (number of foreign materials) was measured by the following procedure. The evaluation results are presented in Table 1.

The number of foreign materials having a size of 0.09 μm or more, which were obtained after the polished substrates were cleaned under the cleaning conditions described above using the various surface treatment compositions, was measured. For the measurement of the number of foreign materials, SURFSCAN SP2 manufactured by KLA Tencor Corp. was used. Measurement was performed for the area on one surface of the cleaned substrate, remaining after excluding those areas extending over a width of 5 mm from the outer circumferential edges. The symbol "-" in the table means that measurement was not performed.

[Measurement of Tungsten Etching Rate]

As an indicator of the effect of suppressing dissolution of a tungsten layer, an etching test was performed by the operation described below. That is, etching was performed by immersing a tungsten wafer (size: 32 mm×32 mm) into a sample container containing 300 mL of each of the various surface treatment compositions under stirring at 300 rpm, for 10 minutes at 60° C. After the immersion, the tungsten wafer was cleaned with pure water for 30 seconds and was dried by air blow drying using an air gun. The thicknesses (film thicknesses) of the tungsten wafer before and after the etching test were measured using a sheet resistance measuring apparatus (VR-120, manufactured by Hitachi Kokusai Electronics, Inc.). The etching rate (Å/min) was determined by dividing the difference between the thicknesses (film thicknesses) of the tungsten wafer obtained before and after the etching test, by the time taken by the etching test, as described below (method for calculating the etching rate). In the table, the etching rate calculated per 30 minutes (Å/30 minutes) is presented.

(Method for Calculating Etching Rate)

The etching rate (Å/min) was calculated by the following mathematical formula (1).

[Math. 1]

$$\text{Etching rate (Å/min)} = \frac{\begin{bmatrix}\text{Film thickness (Å) of object}\\\text{to be cleaned before etching}\end{bmatrix} - \begin{bmatrix}\text{Film thickness (Å) of object}\\\text{to be cleaned after etching}\end{bmatrix}}{[\text{Etching time (min)}]} \quad \text{Mathematical Formula (1)}$$

TABLE 1

| Surface treatment composition No. | Tungsten etching inhibitor | | Water-soluble polymer | W etching rate (Å/30 minutes) | Number of defects (pieces) |
|---|---|---|---|---|---|
| | Type | Concentration (g/kg) | Concentration (g/kg) | | |
| Example 1 | A-1 | 3-Amino-4-methylbenzoic acid | 1 | — | 4.7 | 100 |
| Example 2 | A-2 | 5-Aminoisophthalic acid hydrate | 1 | — | 4.2 | 111 |
| Example 3 | A-3 | 3,4-Diaminobenzoic acid | 1 | — | 4.1 | 98 |
| Example 4 | A-4 | Sodium 3-aminobenzoate | 1 | — | 4.8 | 139 |
| Example 5 | A-5 | 3-Nitrobenzoic acid | 1 | — | 4.1 | 87 |
| Example 6 | A-6 | 3-Amino-4-methylbenzoic acid | 1 | 1 | 3.5 | 122 |
| Example 7 | A-7 | 5-Aminoisophthalic acid hydrate | 1 | 1 | 3.3 | 68 |
| Example 8 | A-8 | 3,4-Diaminobenzoic acid | 1 | 1 | 2.7 | 77 |
| Example 9 | A-9 | Sodium 3-aminobenzoate | 1 | 1 | 4.5 | 89 |
| Example 10 | A-10 | 3-Nitrobenzoic acid | 1 | 1 | 3.3 | 100 |
| Comparative Example 1 | C-1 | — | — | — | 7.4 | 178 |
| Comparative Example 2 | C-2 | — | — | 1 | 6.1 | 181 |
| Comparative Example 3 | C-3 | Imidazole | 1 | — | 6.0 | 207 |
| Comparative Example 4 | C-4 | DL-tryptophan | 1 | — | 4.9 | 155 |
| Comparative Example 5 | C-5 | Arginine | 1 | — | 5.2 | 151 |
| Comparative Example 6 | C-6 | Octyl phosphate | 1 | — | 5.2 | 160 |
| Comparative Example 7 | C-7 | Sodium lauroyl sarcosine | 1 | — | 6.0 | 301 |
| Comparative Example 8 | C-8 | Ammonium POE lauryl sulfate | 1 | — | 6.1 | 156 |
| Comparative Example 9 | C-9 | Mellitic acid | 1 | — | 5.5 | 211 |

As is obvious from Table 1 shown above, it was found that when the surface treatment compositions of the Examples are used to perform a surface treatment, the surface treatment compositions have excellent defect removal performance and are capable of significantly suppressing dissolution of the tungsten layer, compared to the surface treatment compositions of the Comparative Examples.

The present patent application is based on Japanese Patent Application No. 2017-179297, filed on Sep. 19, 2017, the entire disclosure of which is incorporated herein by reference.

What is claimed is:

1. A surface treatment composition having a pH of 4 or lower and used for treating the surface of a polished object to be polished having a layer containing tungsten,
the surface treatment composition comprising a tungsten etching inhibitor, a water-soluble polymer, and water,
wherein the tungsten etching inhibitor is a compound containing a monocyclic or fused polycyclic aromatic hydrocarbon ring having two or more substituents, and the substituents comprise at least a nitrogen-containing group and an anionic group, and
the surface treatment composition substantially does not comprise abrasive grains.

2. The surface treatment composition according to claim 1, wherein the aromatic hydrocarbon ring is a benzene ring or a naphthalene ring.

3. The surface treatment composition according to claim 1, wherein the nitrogen-containing group is an amino group or a nitro group.

4. The surface treatment composition according to claim 1, wherein the anionic group is a carboxylic acid group or a carboxylic acid salt group.

5. The surface treatment composition according to claim 1, wherein the tungsten etching inhibitor comprises at least one selected from the group consisting of 3-amino-4-methylbenzoic acid, 5-aminoisophthalic acid hydrate, 3,4-diaminobenzoic acid, sodium 3-aminobenzoate, and 3-nitrobenzoic acid.

6. The surface treatment composition according to claim 1, wherein the water-soluble polymer is a polymer compound having a sulfonic acid group or a sulfonic acid salt group.

7. A method for producing the surface treatment composition according to claim 1, the method comprising mixing the tungsten etching inhibitor, the water-soluble polymer, and the water.

8. A surface treatment method, comprising surface-treating a polished object to be polished having a layer containing tungsten, using the surface treatment composition according to claim 1.

9. The surface treatment method according to claim 8, wherein the surface treatment is carried out by rinse polishing or cleaning.

10. A method for producing a semiconductor substrate, the method comprising a surface treatment step of surface-treating a polished object to be polished by the surface treatment method according to claim 8,
wherein the polished object to be polished is a polished semiconductor substrate having a layer containing tungsten.

11. The surface treatment composition according to claim 6, wherein the polymer compound having the sulfonic acid group or the sulfonic acid salt group is at least one selected from the group consisting of a sulfonic acid (salt) group-containing polyvinyl alcohol, a sulfonic acid (salt) group-containing polystyrene, a sulfonic acid (salt) group-containing polyvinyl acetate, a sulfonic acid (salt) group-containing polyester and a copolymer of a (meth)acrylic group-containing monomer and a sulfonic acid (salt) group-containing monomer.

12. The surface treatment composition according to claim 1, wherein the content of the tungsten etching inhibitor is 0.01 g/kg or more and 15 g/kg or less with respect to the total amount of the surface treatment composition.

13. The surface treatment composition according to claim 6, wherein the content of the polymer compound having the sulfonic acid group or the sulfonic acid salt group is 0.01 g/kg or more and 5 g/kg or less with respect to the total amount of the surface treatment composition.

14. The surface treatment composition according to claim 1, further comprising a pH adjusting agent of at least one selected from the group consisting of sulfuric acid, nitric acid, boric acid, carbonic acid, hypophosphorous acid, phosphorous acid, phosphoric acid, formic acid, acetic acid, propionic acid, butyric acid, valeric acid, 2-methylbutyric acid, n-hexanoic acid, 3,3-dimethylbutyric acid, 2-ethylbutyric acid, 4-methylpentanoic acid, n-heptanoic acid, 2-methylhexanoic acid, n-octanoic acid, 2-ethylhexanoic acid, benzoic acid, glycolic acid, salicylic acid, glyceric acid, oxalic acid, malonic acid, succinic acid, glutaric acid, adipic acid, pimellic acid, maleic acid, phthalic acid, malic acid, tartaric acid, citric acid, lactic acid, methanesulfonic acid, ethanesulfonic acid and isethionic acid.

* * * * *